United States Patent
White

(10) Patent No.: US 6,347,042 B1
(45) Date of Patent: Feb. 12, 2002

(54) PRINTED CIRCUIT BOARD TOP SIDE MOUNTING STANDOFF

(75) Inventor: Wade White, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/427,429

(22) Filed: Oct. 26, 1999

(51) Int. Cl.7 .................................................. H05K 1/11
(52) U.S. Cl. ...................... 361/784; 361/736; 361/742; 361/803; 174/138 D; 174/138 G
(58) Field of Search .................................. 361/716, 736, 361/748, 719, 742, 785, 801, 803, 804, 683, 758; 439/71; 174/138 D, 138 G, 138 R

(56) References Cited

U.S. PATENT DOCUMENTS

| | | |
|---|---|---|
| 4,167,772 A | 9/1979 | Baehne |
| 4,640,639 A | 2/1987 | Matsui |
| 4,665,467 A * | 5/1987 | Speraw et al. ................. 357/81 |
| 4,745,530 A * | 5/1988 | Farrel, Jr. et al. ............ 362/226 |
| 4,760,495 A | 7/1988 | Till |
| 4,875,140 A * | 10/1989 | Delpech ...................... 361/412 |
| 5,345,366 A * | 9/1994 | Cheng et al. ................ 361/785 |
| 5,903,439 A * | 5/1999 | Tamarkin ..................... 361/742 |
| 5,956,835 A * | 9/1999 | Aksu ........................... 29/468 |
| 6,175,342 B1 * | 1/2001 | Nicholson et al. ............. 345/1 |

* cited by examiner

Primary Examiner—Jeffrey Gaffin
Assistant Examiner—Thanh Y. Tran
(74) Attorney, Agent, or Firm—Floyd Gonzalez; Cantor Colburn LLP

(57) ABSTRACT

A printed circuit board top side mounting system is presented and includes a printed circuit board having a primary side and a secondary side. The printed circuit board top side mounting system also has a surface member that has a point with a generally constant distance in relation to the primary side. The printed circuit board top side mounting system further includes a standoff with a elongated shape which has a predetermined set dimension that includes the constant distance disposed in going through a slot in the printed circuit board. The standoff further includes a first end disposed to fixing the first end rigidly on the printed circuit board and a second end disposed in connecting rigidly to the surface member.

12 Claims, 1 Drawing Sheet

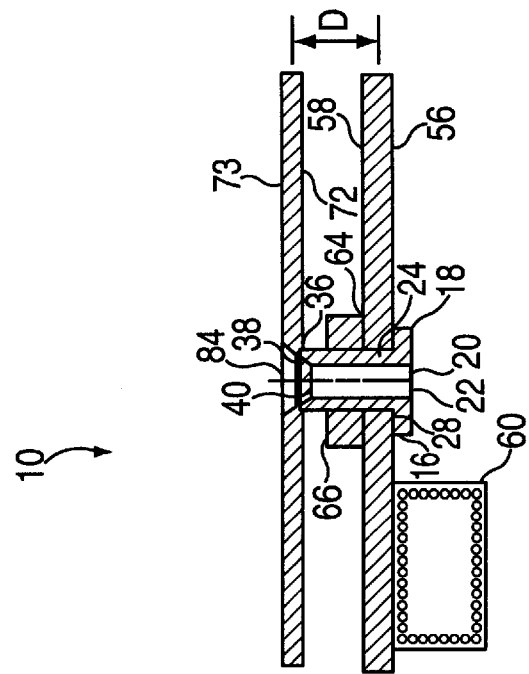
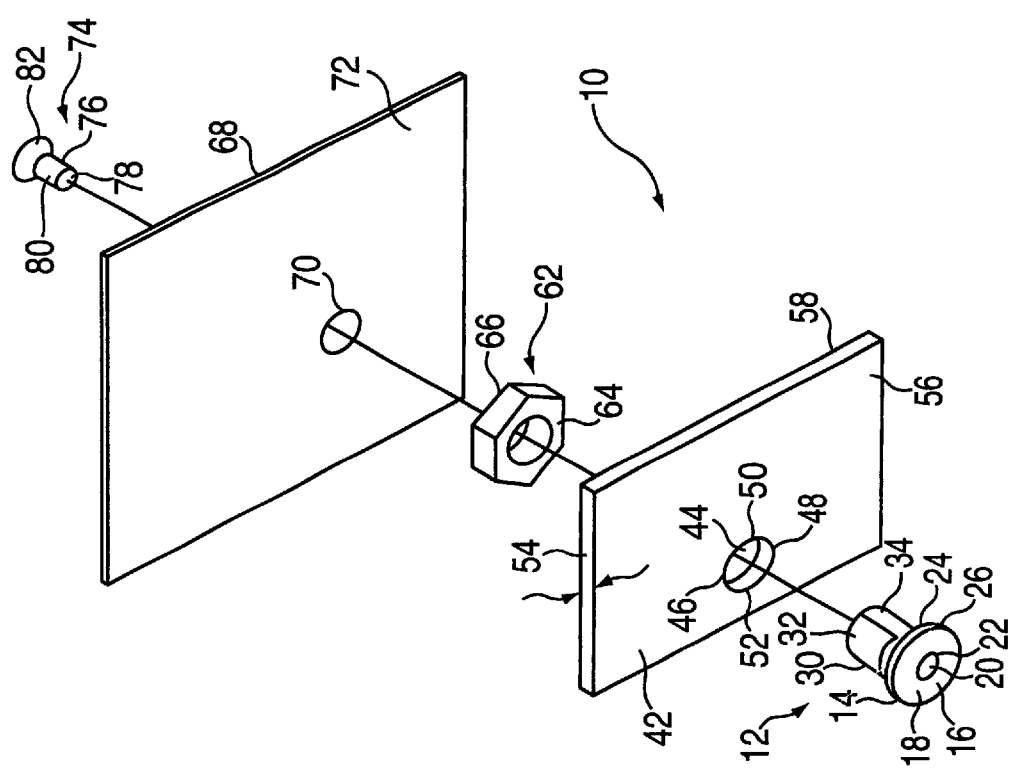

PRINTED CIRCUIT BOARD TOP SIDE MOUNTING STANDOFF

TECHNICAL FIELD

The present invention relates generally to a printed circuit board mounting standoff, and, more particularly, to a printed circuit board mounting system wherein a preset dimension is defined between one side of the printed circuit board and a reference surface.

BACKGROUND OF THE INVENTION

The usage of a spacing member to separate two of more planes is well known. In the printed circuit field, it is desirable to affix a printed circuit board to a reference surface such a casing or other related surfaces. The printed circuit board typically has two sides. A side that has most of components mounted upon is generally known as the primary side. Consequentially, the other side of the printed circuit board is generally known as the secondary side. Various mounting schemes are known. U.S. Pat. No. 4,640,639 describes a temporary fixing member that couples a plurality of printed circuit boards. U.S. Pat. No. 4,760,495 describes a device which uses the secondary side as a reference plane for spacing between adjacent planar elements in electronic devices. U.S. Pat. No. 4,875,140 describes a support for two printed circuit boards parallel to each other. U.S. Pat. No. 4,167,772 describes a mount on a printed circuit board with a fixed spaced relationship to a second mounting plate is described. However, these prior art mounting schemes do not address a requirement of a component mounted on the primary side of the printed circuit board needs to be aligned with a point on a component outside of the printed circuit board mounting system, the aforementioned mounting systems do not satisfy the requisite alignment because variations in thickness of the printed circuit board may cause misalignment.

SUMMARY OF THE INVENTION

The above-discussed and other drawbacks and deficiencies of the prior art are overcome or alleviated by a printed circuit board top side mounting standoff of the present invention. A printed circuit board top side mounting system is presented and includes a printed circuit board having a primary side and a secondary side and a surface member having a point with a constant distance with the primary side. A standoff with an elongated shape having a predetermined set dimension including a segment with the constant distance disposed in going through a slot in the printed circuit board is also described. The standoff further includes a first end disposed to fixing the first end rigidly on the printed circuit board, as well as a second end disposed to connecting rigidly to the surface member. In other words, a printed circuit board top side mounting standoff is described such that the primary side of the printed circuit board stays at a constant distance in relation to a third point caused by the predetermined set dimension including a segment with the constant distance disposed in going through a slot in the printed circuit board.

BRIEF DESCRIPTION OF THE DRAWINGS

Referring now to the drawings wherein like elements are numbered alike in the several FIGURES.

DESCRIPTION OF AN EMBODIMENT OF THE INVENTION

Figure 2:
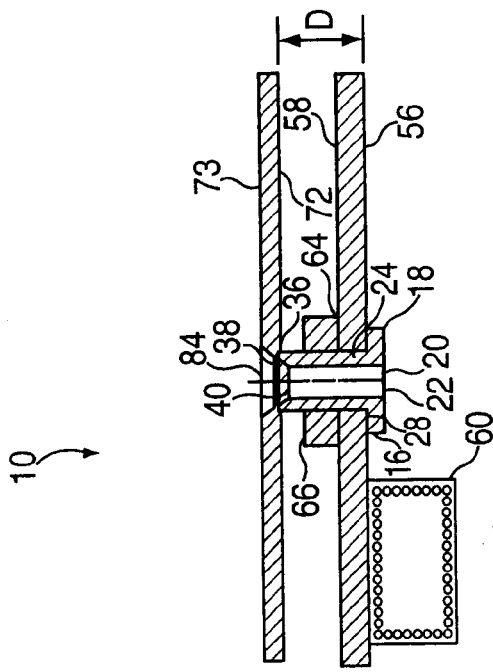
FIG. 2 is a sectional view of the printed circuit board top side mounting system along a line segment following a center line of a standoff in FIG. 1.
Figure 1:
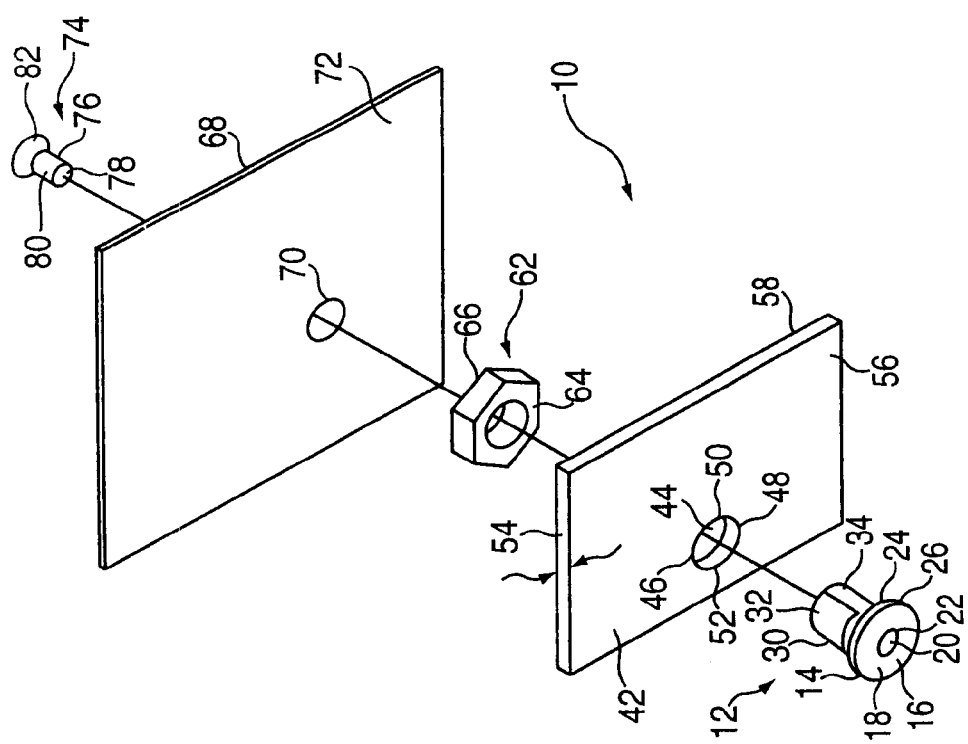
FIG. 1 is a perspective view of a printed circuit board top side mounting system of the present invention.

Referring to FIGS. 1 and 2, a preferred embodiment of the printed circuit board mounting system, generally designated 10 is shown. A standoff 12 includes a disk section 14 having a first surface 16. The first surface 16 includes a first end 18 which has a generally circular or semicircular shape comprising solid material. Furthermore, the first surface 16 generally defines part of the contour of the disk section 14 as well as one end surface of the standoff 12. The first surface 16 further includes a second end 20 which is encompassed by the first end 18. The second end 20 is hollow and constitutes the standoff 12. The second end 20 has a circular edge 22 that defines a circle which in turn defines a plane part which constitutes the second end 20. The plane further extends to encompass the first end 18 to form the first surface 16. The disk section 14 further includes a second surface 24. The second surface 24 includes an outer edge 26 which is semicircular in shape that defines a plane 28 therein.

The standoff 12 further includes an elongated section 30. The elongated section 30 includes a curved surface 32 and a complementary section (not shown) forming part of the elongated surface of the elongated section 30 that extends from the disk section 14 toward the opposing end of the standoff 12. The curved surface 32 includes threaded portions (not shown). The complementary section includes complementary threaded portions (not shown) as well. The elongated section 30 further includes a flat surface 34 that forms the remaining part between the curved surface 32 and the complementary section. Correspondingly, the elongated section 30 further includes another flat surface (not shown) forming a complementary flat surface in relation to the flat surface 34. The elongated section 30 further comprises an edge 36 at the opposing end to the disk section 14. The edge 36 defines a surface 38 forming the contours of the opposing end.

The standoff 12 further includes a hollowed inner section 40 that has one end that starts at the surface 38 forming the contours of the opposing end. The hollowed inner section 40 then proceeds through the elongated section 30 and further transcend the disk section 14. The hollowed inner section 40 ends at the second end 20 which is encompassed by the first end 18. The hollowed inner section 40 further includes threaded portions (not shown).

A printed circuit board 42 having a general rectangular shape is shown, by way of example only. The printed circuit board 42 comprises a slot 44. The slot 44 includes a curved section 46 which has a complementary curved section 48. The curved section 46 and the complementary curved section 48 form a curved contour portion of the slot 44. The remaining sections of the slot 44 include a flat section 50 which has a complementary flat section 52. The curved section 46 and the complementary curved section 48 together with the flat section 50 and the complementary flat section 52 form the complete inner contour of the slot 44. In addition, the flat section 50 and the complementary flat section 52 together with the thickness 54 define a pair of flat surfaces within the slot 44. The printed circuit board 42 further has a thickness 54 that is generally distributed across the printed circuit board 42. In other words, the thickness 54 is generally the same in a neighborhood of the slot 44. In addition, the flat section 50 and the complementary flat section 52 together with the thickness 54 define a pair of flat surfaces within the slot 44.

The printed circuit board 42 further comprises a primary side 56 and a secondary side 58. The primary side 56 generally receives most of components that are mounted on the printed circuit board 42 including a surface connector 60 (as shown in FIG. 2) that connect to other connecting elements (not shown) outside or independent of the preferred embodiment of the printed circuit board mounting system 10. It can be appreciated that accurate alignment with the other connecting elements is critical to a system design.

A second affixing member, preferably a nut 62 with a hexagon shape, is described. The six sides of the hexagon shape define a locking surface 64, as well as an exposed surface 66. The locking surface 64 and the exposed surface 66 together with the six sides form the contour of the nut 62.

A surface member or reference member 68 which forms part of a larger plane is described. The surface member or reference member 68 comprises an opening 70 which is generally round in shape. The surface member or reference member 68 further includes an inner side 72, as well as an outer side 73. The surface member or reference member 68 is preferably made of sheet metal whereby both the inner side 72, as well as the outer side 73 form a rigid preferably flat surface.

A first affixing member, preferably a screw 74 comprising a first section 76, is described. The first section 76 is an elongated cylinder with a first generally circular side 78 and a surface side 80. The surface side 80 forms the elongated surface of the cylinder. In addition, the surface side 80 has threaded portions thereon (not shown). The screw 74 further comprises a second section 82. The second section 82 is a continuation of the first section 76 along a direction opposite of the first generally circular side 78. The second section 82 has a conical shape which defines a conical surface 83 in that the second section 82 starts at a smaller sectional area, and as the portions of the second area moves away from the first section 76, the sectional area gradually forms larger sectional areas. The second section 82 further comprises a second generally circular side 84 opposing the first generally circular side 78. The first generally circular side 78 and the second generally circular side 84, together with the conical surface 83 and the surface side 80, form the contour of the screw 74.

The standoff 12 is applied by extending the hollowed inner section 40 side first through the slot 44 of the printed circuit board 42 with the flat surface 34 and the complementary flat surface in relation to the flat surface 34 by fitting the flat surface 34 and the complementary flat surface in relation to the flat surface 34 adjustably through the slot 44 by sliding the standoff 12 along the flat section 50 and the complementary flat section 52 such that tension of the printed circuit board 42 is reduced to a desirable level. The printed circuit board 42 is affixed rigidly to the standoff 12 by the nut 62 by turning the nut 62 thereby fastening the standoff 12 to the nut 62 via the threaded surfaces on both a surface of the standoff 12 and the nut 62 respectively. The standoff 12 is further affixed rigidly onto the surface member 68 by the screw 74. The first section 76 of the screw 74 is extended first through the opening 70 of the surface member 68. The screw 74 is turned thereby the threaded surface 80 is connected to the inner threaded surface of the standoff 12 within the hollowed inner section 40.

It will be appreciated that a distance D, defined as a line segment between a first surface section of the inner side 72 and a second surface section of the primary side 56, remains generally constant. In other words, if the second section 32 of the standoff 12 has a generally fixed or constant length, the distance D is generally constant. In addition, the distance D is independent of the thickness 54 of the printed circuit board 42 if there is sufficient room remaining between the primary side 56 and the inner side 72 to place the nut 62 in between, as well as room for the thickness 54. In this way, any components on the primary side 56 of the printed circuit board 42, such as the surface connector 60, that need alignment with a device outside of the system 10 will have a definite fixed location within the space of the printed circuit board mounting system 10 for suitable alignment purposes. Moreover, this suitable alignment is independent of the thickness 54 of the printed circuit board 42.

It will also be appreciated that a plurality of standoffs 12 may be implemented for the printed circuit board mounting system 10. Furthermore, the length of the elongated section 30 of the standoffs 12 may be equal in relation to each other. Or the length of the elongated section 30 may be suitably not equal in relation to each other for a desired alignment with a device outside the printed circuit board mounting system 10.

In another embodiment of the instant invention, the coupling between the standoffs 12 the printed circuit board 42, and the surface member 68 may be achieved by some means other than threaded connection as shown in the above preferred embodiment. For example, coupling by rivets or soldering or any other kind of suitable coupling may be utilized.

It will be understood that a person skilled in the art may make modifications to the preferred embodiment shown herein within the scope and intent of the claims. While the present invention has been described as carried out in a specific embodiment thereof, it is not intended to be limited thereby but intended to cover the invention broadly within the scope and spirit of the claims.

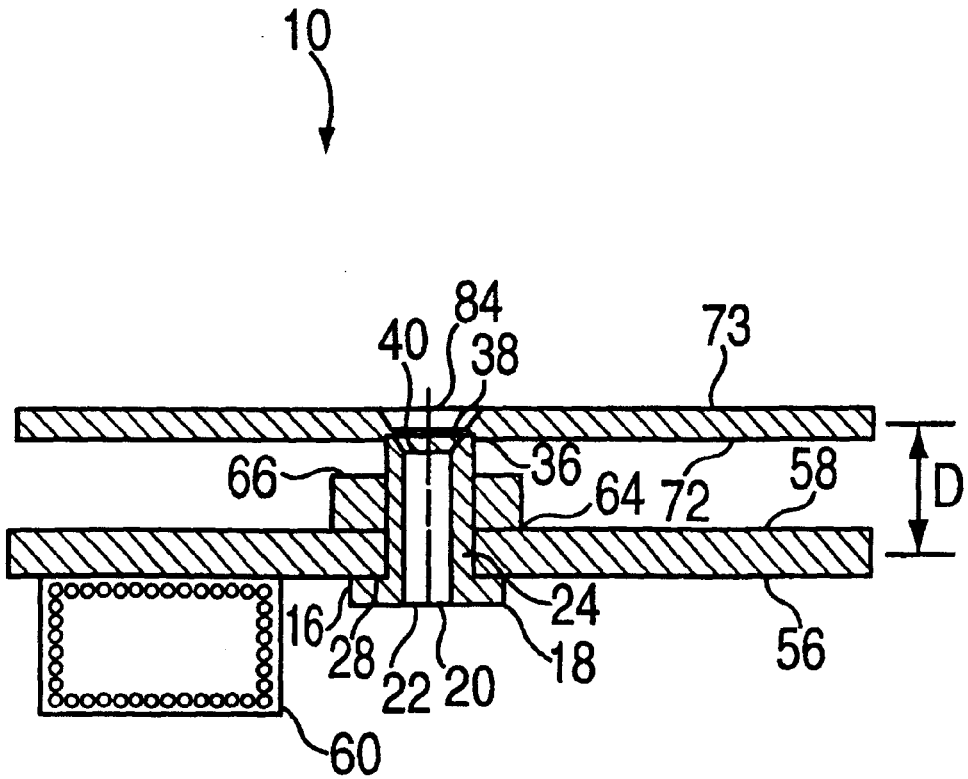

What is claimed is:

1. A printed circuit board mounting assembly, comprising:
   a printed circuit board having a primary side and a secondary side;
   a surface member having a point with generally a constant distance in relation to the primary side; and
   a standoff with a elongated shape having a predetermined set dimension including the generally constant distance extending through a slot in the printed circuit board, the standoff further comprising:
   a threaded inner surface and a threaded outer surface on an elongated section;
   a first end connected to the printed circuit board and a second end connected to the surface member; and
   the elongated section having a curved surface and a complementary curved surface, and the elongated section further having a flat surface and a complementary flat surface.

2. The printed circuit board mounting assembly of claim 1 further comprising:
   a first affixing member to affix the standoff rigidly to the surface member.

3. The printed circuit board mounting assembly of claim 2 wherein the first affixing member comprises a screw threadedly connected to the threaded inner surface of the standoff.

4. The printed circuit board mounting assembly of claim 2 wherein the surface member comprises a sheet metal plate having an inner surface and an outer surface, wherein the inner surface defines a starting point for the generally constant distance with the primary side.

5. The printed circuit board mounting assembly of claim 2 wherein the surface member includes a hole therein for receiving the first affixing member affixed to the standoff.

6. The printed circuit board mounting assembly of claim 1 further comprising:

a second affixing member to affix the standoff rigidly to the printed circuit board.

7. The printed circuit board mounting assembly of claim 6 wherein the second affixing member comprises a nut threadedly connected to the threaded outer surface of the standoff.

8. The printed circuit board mounting assembly of claim 1 wherein the primary side has components mounted thereon with the components including a surface connector.

9. The printed circuit board mounting assembly of claim 1 wherein the slot has a dimension greater than that of the standoff, wherein the printed circuit board is adjustably connected to the standoff.

10. The printed circuit board mounting assembly of claim 9 wherein the slot has a generally oval shape for adjustment, wherein the printed circuit board is adjustably connected to the standoff.

11. A method for adjustably mounting a printed circuit board on a surface member using a standoff, the method comprising:

determining a primary side and a secondary side of the surface member;

locating the standoff having a generally constant distance with the primary side, the standoff further comprising:

a threaded inner surface and a threaded outer surface; and an elongated section having a curved surface and a complementary curved surface, and the elongated section further having a flat surface and a complementary flat surface;

creating a slot on the printed circuit board with the slot having greater dimension than a segment of the standoff;

extending the segment of the standoff through the slot;

adjusting the printed circuit board to reduce tension therein; and affixing the standoff to the surface member at the generally constant distance.

12. The method for adjustably mounting the printed circuit board on the surface member using the standoff of claim 11 further comprising:

affixing a first affixing member to an end of the standoff to rigidly connect the standoff to the surface member; and affixing a second affixing member to the segment of the standoff to rigidly connect the standoff to the printed circuit board.

* * * * *

UNITED STATES PATENT AND TRADEMARK OFFICE
CERTIFICATE OF CORRECTION

| | | |
|---|---|---|
| PATENT NO. | : 6,347,042 B1 | Page 1 of 3 |
| APPLICATION NO. | : 09/427429 | |
| DATED | : February 12, 2002 | |
| INVENTOR(S) | : Wade White | |

It is certified that error appears in the above-identified patent and that said Letters Patent is hereby corrected as shown below:

Title Page,
Please delete illustrative figure and Substitute the attached Figure 2.

Figure 2,
Please delete illustrative figure and Substitute the attached Figure 2.

Signed and Sealed this

Tenth Day of October, 2006

JON W. DUDAS
*Director of the United States Patent and Trademark Office*

United States Patent
White

(10) Patent No.: US 6,347,042 B1
(45) Date of Patent: Feb. 12, 2002

(54) PRINTED CIRCUIT BOARD TOP SIDE MOUNTING STANDOFF

(75) Inventor: Wade White, Hyde Park, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/427,429

(22) Filed: Oct. 26, 1999

(51) Int. Cl.$^7$ ................................................ H05K 1/11
(52) U.S. Cl. ................... 361/784; 361/736; 361/742; 361/803; 174/138 D; 174/138 G
(58) Field of Search ................................ 361/716, 736, 361/748, 719, 742, 785, 801, 803, 804, 683, 758; 439/71; 174/138 D, 138 G, 138 R

(56) References Cited

U.S. PATENT DOCUMENTS

| | | | |
|---|---|---|---|
| 4,167,772 A | | 9/1979 | Baehne |
| 4,640,639 A | | 2/1987 | Matsui |
| 4,665,467 A | * | 5/1987 | Speraw et al. ............... 357/81 |
| 4,745,530 A | * | 5/1988 | Farrel, Jr. et al. ............. 362/226 |
| 4,760,495 A | | 7/1988 | Till |
| 4,875,140 A | * | 10/1989 | Delpech ....................... 361/412 |
| 5,345,366 A | * | 9/1994 | Cheng et al. ................. 361/785 |
| 5,903,439 A | * | 5/1999 | Tamarkin ...................... 361/742 |
| 5,956,835 A | * | 9/1999 | Aksu ............................. 29/468 |
| 6,175,342 B1 | * | 1/2001 | Nicholson et al. ............. 345/1 |

* cited by examiner

Primary Examiner—Jeffrey Gaffin
Assistant Examiner—Thanh Y. Tran
(74) Attorney, Agent, or Firm—Floyd Gonzalez; Cantor Colburn LLP

(57) ABSTRACT

A printed circuit board top side mounting system is presented and includes a printed circuit board having a primary side and a secondary side. The printed circuit board top side mounting system also has a surface member that has a point with a generally constant distance in relation to the primary side. The printed circuit board top side mounting system further includes a standoff with a elongated shape which has a predetermined set dimension that includes the constant distance disposed in going through a slot in the printed circuit board. The standoff further includes a first end disposed to fixing the first end rigidly on the printed circuit board and a second end disposed in connecting rigidly to the surface member.

12 Claims, 1 Drawing Sheet